United States Patent

Yokoyama et al.

Patent Number: 5,832,597
Date of Patent: Nov. 10, 1998

[54] METHOD AND APPARATUS FOR INSERTING ELECTRONIC COMPONENT

[75] Inventors: Dai Yokoyama; Kiyoshi Imai; Hideaki Watanabe, all of Kofu; Hiromi Kinoshita, Kitakyushu, all of Japan

[73] Assignee: Matsushita Electric Industrial Co., Ltd., Osak, Japan

[21] Appl. No.: 594,518

[22] Filed: Jan. 31, 1996

[30] Foreign Application Priority Data

Jan. 31, 1995 [JP] Japan ................................ 7-014100

[51] Int. Cl.[6] ............................................ H05K 3/30
[52] U.S. Cl. .................. 29/837; 29/564.1; 29/564.6; 29/741
[58] Field of Search ................. 29/741, 566.1, 29/566.2, 837, 564.1, 564.6

[56] References Cited

U.S. PATENT DOCUMENTS

| | | | |
|---|---|---|---|
| 3,488,672 | 1/1970 | Martyn | 29/741 X |
| 3,593,404 | 7/1971 | Ragard | 29/741 X |
| 3,594,889 | 7/1971 | Clark | 29/741 X |
| 3,597,824 | 8/1971 | Yoshida et al. | 29/741 X |
| 4,202,092 | 5/1980 | Shibasaki et al. | |
| 4,205,433 | 6/1980 | Araki et al. | 29/741 X |
| 4,370,804 | 2/1983 | Misawa et al. | 29/741 |
| 4,635,341 | 1/1987 | Staudinger | 29/741 X |

*Primary Examiner*—Carl J. Arbes
*Attorney, Agent, or Firm*—Wenderoth, Lind & Ponack, L.L.P.

[57] ABSTRACT

Insertion guides are mounted to slide blocks supported by a guide to be close to or away from each other. The slide blocks are meshed with nut parts of a ball screw threaded in both directions. When the ball screw is rotated via a driving pulley, a belt, and a driven pulley by a rotating/driving device set in an insertion head, the slide blocks and insertion guides mounted to the slide blocks are moved, so that an insertion pitch is changed. When the insertion head is rotated by a rotating/driving device via a driving pulley, a belt, and a driven pulley, an insertion direction is changed as well.

6 Claims, 7 Drawing Sheets

METHOD AND APPARATUS FOR INSERTING ELECTRONIC COMPONENT

BACKGROUND OF THE INVENTION

The present invention relates to a method and an apparatus for automatically inserting axial type electronic components (axial parts) into predetermined insertion holes of a board.

The constitution of a conventional inserting apparatus for electronic components is shown in FIGS. 3–8. An inserting operation of the electronic components by the apparatus is indicated in a flow chart of FIG. 9.

Figure 3:
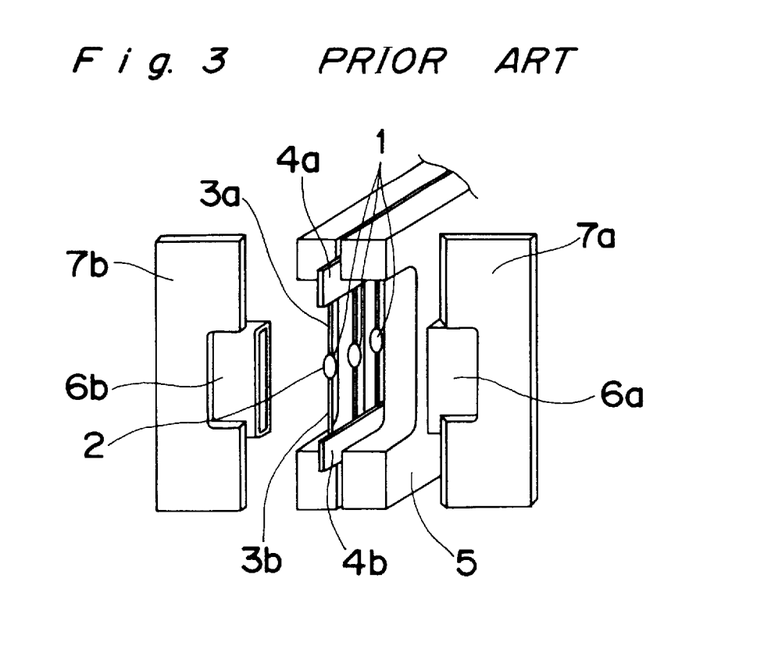
FIG. 3 is a perspective view of a part of an electronic component holding member and a tape cutting member in a conventional electronic component inserting apparatus.

FIG. 3 is a perspective view of a part of a component holding member and a tape cutting member in a conventional inserting apparatus for axial-type electronic components. In FIG. 3, electronic components 1 are tape-bonded at a fixed distance. A pair of lead wires 3a and 3b are extended in an axial direction of a main body 2 of the electronic component 1. Ends of the lead wires 3a and 3b are respectively held by tapes 4a and 4b. Many electronic components 1 are thus connected to each other with a predetermined pitch, forming a tape-like collection of electronic components. The electronic components 1 of the collection are set and sequentially fed to a predetermined position by a feeding guide 5. The component holding member is formed in the constitution as above.

Measuring means 6a and 6b constructed by an optical sensor or the like detect when each electronic component 1 reaches the predetermined position (tape cut position). Tape cutters 7a and 7b, disposed at the sides of and downstream of the measuring means 6a and 6b, of a component feeding member constitute a tape cutting member, and cut and separate the tapes 4a and 4b of every electronic component 1. The mechanism parts 5, 6, and 7 operate in association with a controlling part (not shown).

Figure 4:
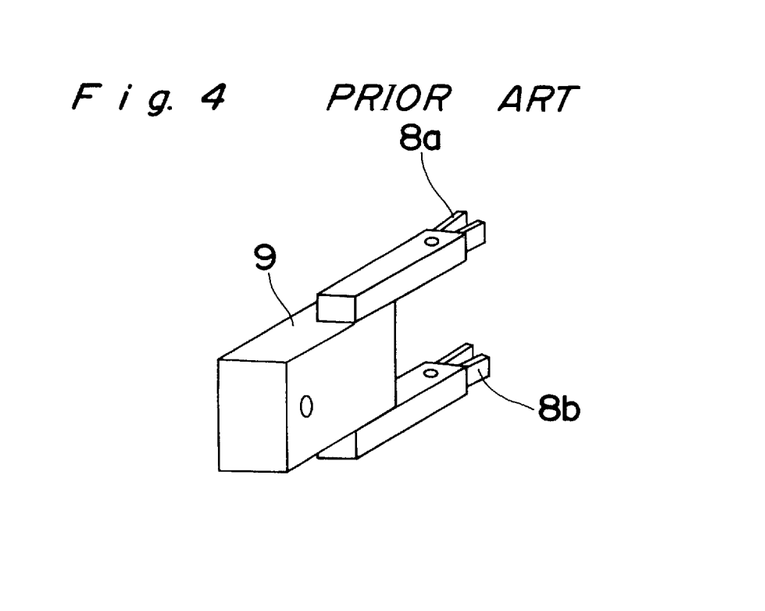
FIG. 4 is a perspective view of a part of an electronic component transferring member in the conventional apparatus.

FIG. 4 is a perspective view of an essential part of a component transferring member in the conventional inserting apparatus. In FIG. 4, a pair of holding hooks (chucks) 8a and 8b are set at a main body 9 of the transferring member, holding the electronic component 1 of FIG. 3, and transferring it to a predetermined position where the electronic component is delivered to an insertion head 10 (FIG. 5) of an inserting unit of FIG. 5.

Figure 5:
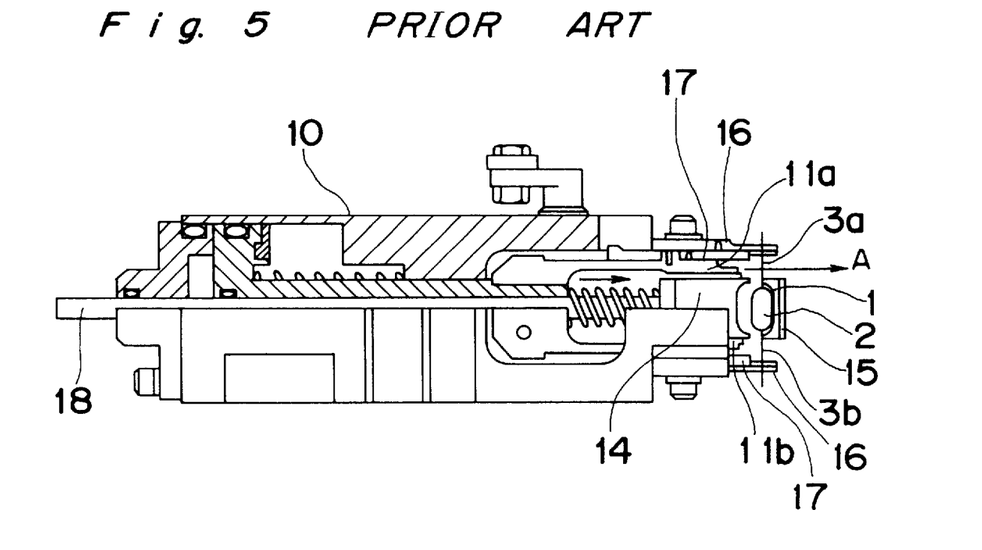
FIG. 5 is a partial sectional view showing the constitution of an insertion head of an inserting unit in the conventional apparatus.
Figure 6:
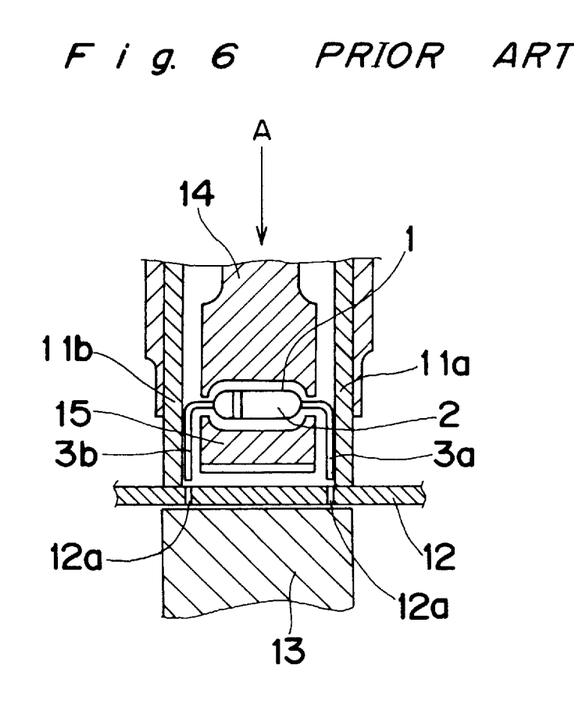
FIG. 6 is an enlarged view of a part of FIG. 5.
Figure 8:
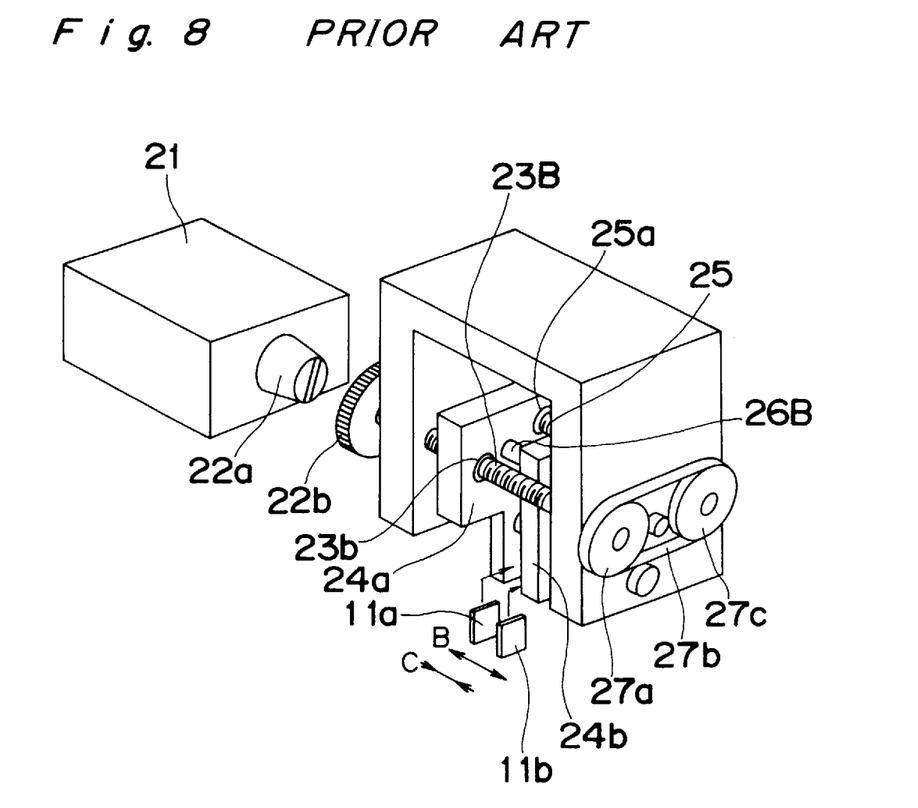
FIG. 8 is a perspective view of another example of the adjusting mechanism.

FIG. 5 is a partial sectional view showing the constitution of the insertion head of the inserting unit of the conventional inserting apparatus, and FIG. 6 is an enlarged view of its essential part. Referring to FIGS. 5 and 6, 10 is the insertion head and 11a and 11b are insertion guides mounted at a pair of slide blocks 24a and 24b (FIG. 8). As is exemplified in FIG. 6, the insertion guides 11a, 11b fold and hold the lead wires 3a and 3b and guide them to an upper surface of a board 12. A fixed stage 13 as a fixing member is provided at the side of a lower surface of the board 12.

A pusher 14 presses the main body 2 of the electronic component 1 in a direction of an arrow A to thereby insert the lead wires 3a and 3b into predetermined insertion holes 12a of the board 12. A holder 15 holds the main body 2 of the electronic component 1 sent from the arrow direction A by the pusher 14. The pair of lead wires 3a and 3b are cut by fixed lead cutters 16 and movable lead wire cutters 17 which are moved in the arrow direction A.

After the lead wires 3a and 3b are cut by the lead wire cutters 16 and 17 while the lead wires 3a and 3b are held by the pair of holding hooks (chucks) 8a and 8b, the lead wires 3a and 3b are folded by the insertion guides 11a and 11b and inserted into the predetermined insertion holes 12a of the board 12, as shown in FIG. 6.

A driving shaft 18 is rotated by a rotating/driving device (motor) 19. The insertion guides 11a, 11b, the pusher 14, and the movable lead wire cutters 17 are moved in the arrow direction A by the up/down movement of the driving shaft 18 to thereby carry out respective operations depicted hereinabove. An upper and a lower driving mechanisms of the driving shaft 18 are abbreviated here.

Figure 7:
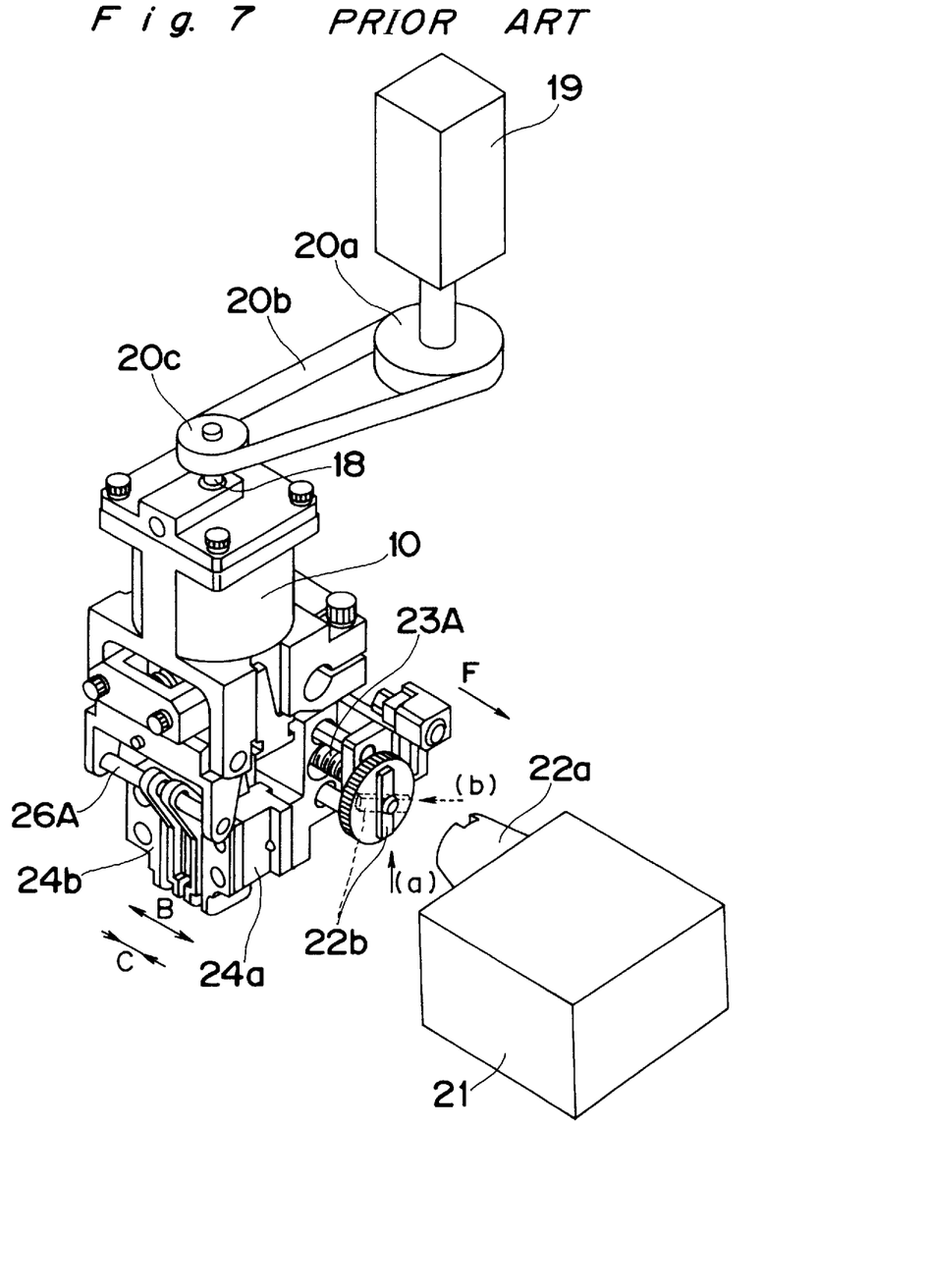
FIG. 7 is a perspective view of an example of an adjusting mechanism for a distance between insertion guides of FIG. 5.

FIG. 7 is a perspective view of an adjusting mechanism for adjusting a distance of the insertion guides 11a and 11b of FIG. 5. The forward/backward rotation of the aforementioned rotating/driving device (motor) 19 is transmitted to the driving shaft 18 via a driving pulley 20a, a belt 20b, and a driven pulley 20c, so that the insertion head 10 is brought into a rotating state (b) shown by a dotted line in FIG. 7 after a predetermined-angles of rotation from an original state (a) shown by a solid line in FIG. 7 or returned from the rotating state (b) to the original state (a) as shown in FIG. 7.

A rotating/driving device (motor) 21 has a joint 22a at a rotary shaft thereof. The joint 22a is meshed with a joint 22b when the insertion head 10 is in the original state (a) of FIG. 7. A driving screw 23A rotates along with the joint 22b. Uniaxial threads are formed on the driving screw 23A in opposite directions from a central part of the screw 23A. The slide blocks 24a and 24b equipped with the insertion guides 11a and 11b are engaged with the double-threaded screw. When the driving screw 23A rotates, the slide blocks 24a and 24b slide and move in a direction of an arrow B or C along a shaft 26A, whereby the distance between the insertion guides 11a and 11b is adjusted.

FIG. 8 is a perspective view of a distance adjusting mechanism for adjusting a distance between the insertion guides 11a and 11b in a different structure from FIG. 7. In FIG. 8, a driven ball screw 25 has threads in an opposite direction to those of a driving ball screw 23B. That is, ball screws 25 and 23B are set in opposite directions. A driving pulley 27a rotates integrally with the driving ball screw 23B. A driven pulley 27c are coupled to the driven ball screw 25. The driven pulley 27c is rotated by the driving pulley 27a via a belt 27b.

The insertion guides 11a and 11b are respectively mounted to the slide blocks 24a and 24b which are supported in a manner to be capable of being close to each other or separated from each other, as described earlier. The slide block 24a is meshed with a nut part 23b of the driving ball screw 23B, while the slide block 24b is meshed with a nut part (not shown) of the driven ball screw 25. Reference numeral 25a in FIG. 8 is a clearance hole formed in the slide block 24a which is not meshed with the driven ball screw 25.

In other words, the driving screw 23B is rotated by the rotating/driving device 21 via the separable joints 22a and 22b which are engaged with each other only when the insertion head 10 is in the original state ((a) of FIG. 7), thereby moving the insertion guides 11a and 11b and eventually changing an insertion pitch.

An inserting operation into the predetermined insertion holes 12a of the board 12 will now be described with reference to the flow chart of FIG. 9 in an example where the distance adjusting mechanism of FIG. 7 (or FIG. 8) is used.

(1) In a first step S21, the rotating/driving device 21 is rotated in response to a rotating direction instruction from the controlling part (not shown). Via the separable joints 22a and 22b meshed with each other only when the insertion head 10 is in the original state (a) of FIG. 7, the rotation is transmitted to the driving screw 23A (or driving ball screw 23B). In consequence, the slide blocks 24a and 24b engaged with the driving screw 23A (or the nut part 23b of the driving ball screw 23B and the nut part of the driven ball screw 25) are moved along the shaft 26a (or 26B) in the arrow direction B or C. The insertion pitch of the insertion guides 11a and 11b mounted to the slide blocks 24a and 24b is accordingly changed in this manner.

(2) In a second step S22, the tape cut position for the electronic component 1 held by the component feeding guide 5 in the component holding member of FIG. 3 is detected by the measuring means 6a and 6b. Responding to this detection, the controlling part drives the tape cutters 7a and 7b to cut the tapes 4a and 4b. The electronic component 1 after the tapes 4a and 4b are cut is delivered to the insertion head 10 indicated in FIGS. 5 and 7 by the pair of holding hooks (chucks) 8a and 8b of the component transferring member.

(3) In a third step S23, the driving shaft 18 is rotated by the rotating/driving device 19 in FIG. 7 via the driving pulley 20a, belt 20b, and driven pulley 20c, and consequently the insertion head 10 is rotated to change an insertion direction.

(4) In a fourth step S24, the movable lead wire cutter 17 of FIG. 5 is moved in the arrow direction A consequent to the up/down movement of the driving shaft 18 of FIG. 7, thereby cutting and folding the lead wires 3a and 3b of the electronic component 1 in the cooperative operation with the fixed lead wire cutter 16 on the fixed side. Thereafter, the lead wires 3a and 3b are folded and held as indicated in FIG. 6 by the insertion guides 11a and 11b and then guided to the upper surface of the board 12.

Then, the main body 2 of the electronic component 1 is pressed in the arrow direction A by the pusher 14 as shown in FIG. 6, and received by the holder 15. The lead wires 3a and 3b are inserted into the predetermined insertion holes 12a of the board 12. The board 12 is supported by the fixed stage 13 at this time.

(5) In a fifth step S25, the driving shaft 18 is reversed via the driving pulley 20a, belt 20b, and driven pulley 20c by the rotating/driving device 19 of FIG. 7. The insertion head 10 is returned to the original position.

If it is not necessary to change the insertion pitch or insertion direction, the above-described operation therefor is omitted.

In the conventional inserting apparatus as above, the rotating/driving device 21 of FIG. 7 is fixedly set, thus allowing changing of the insertion pitch only when the insertion head 10 constituting the inserting unit is meshed with the rotating/driving device 21 via the joints 22a and 22b, resulting in an increase of an insertion cycle time. Since the inserting unit is designed to be separable from the rotating/driving device for changing of the insertion pitch, the constitution becomes complicate and costs are increased. Moreover, the changing mechanism for the insertion pitch uses screws directly, therefore easily causing backlash or rattling subsequent to the abrasion. This invites the deterioration of an insertion reliability, an increasing sliding resistance, and a large driving torque. The rotating/driving device is turned bulky in size.

SUMMARY OF THE INVENTION

An object of the present invention is to provide a method and an apparatus for automatically inserting an axial type of electronic components which can shorten an insertion cycle time by carrying out two operations simultaneously, i.e., an operation to change an insertion direction and an operation to change an insertion pitch, while maintaining a high insertion reliability by suppressing the rattling of screws of an insertion pitch changing mechanism.

In accomplishing these and other aspects, according to a first aspect of the present invention, there is provided an electronic component inserting method for inserting electronic components into insertion holes of a board. Each of the components has a pair of lead wires extended in an axial direction thereof and is tape-bonded at a fixed distance,.

The method comprises a holding step wherein a series of the tape-bonded electronic components is held via tapes. In a cutting step the tapes of the series of the electronic components are cut so as to remove one of the components.

In a transferring step wherein both the tapes and the lead wires of the removed electronic component are held simultaneously and the removed component is transferred to a position for inserting the component into the board.

In an inserting step wherein the lead wires of the removed component are cut and folded in agreement with a pitch of the insertion holes of the substrate, and then guided and inserted into the insertion holes in accordance with a direction of the insertion holes of the board. The insertion direction in which the removed component is inserted in to the board and the pitch by which the removed component is inserted into the board are concurrently changed. In a fixing step wherein the lead wires of the removed component are folded under the board to thereby fix the removed component to the board.

According to a second aspect of the present invention, there is provided an electronic component inserting apparatus for inserting electronic components into insertion holes of a board. Each of the components has a pair of lead wires extended in an axial direction thereof and is tape-bonded at a fixed distance.

The apparatus comprises a holding member for holding a series of the tape-bonded electronic components with tapes. A cutting member cuts the tapes of the series of the electronic components so as to remove one of the components. A transferring member has a pair of holding hooks to simultaneously hold the tapes and the lead wires of the removed component.

An inserting unit has a pair of slide blocks which are slidable in a direction of an insertion pitch and are equipped with mechanisms for cutting. The blocks folding the lead wires of the removed component in agreement with a pitch of the insertion holes of the board and then guiding and inserting the lead wires into the insertion holes of the board. The unit is axially supported in a rotatable fashion in accordance with a direction of the insertion holes of the board. A driving unit set in the inserting unit is for changing a pitch of the pair of slide blocks for cutting/folding and inserting the lead wires into the holes of the board. A fixing member folds the lead wires of the removed component under the board and secures the removed component to the board.

According to a third aspect of the present invention, there is provided an electronic component inserting apparatus for inserting electronic components into insertion holes of a board. Each of the components has a pair of lead wires extended in an axial direction thereof and is tape-bonded at a fixed distance.

The apparatus comprises a holding member for holding a series of the tape-bonded electronic components with a cutting member cuts the tapes of the series of the electronic components so as to remove one of the components. A transferring member has a pair of holding hooks to hold the tapes and the lead wires of the removed component simultaneously.

An inserting unit is provided with mechanisms for cutting and folding the lead wires of the removed component in agreement with a pitch of the insertion holes of the board and then guiding and inserting the bad wires in to the insertion holes of the substrate. The unit is axially supported in a rotatable fashion in accordance with a direction of the insertion holes of the board. The inserting unit comprises a pair of slide blocks for cutting and folding and inserting the lead wires. A guide member holds the slide blocks in a slidable fashion. A ball screw is set in parallel to the guide member and having threads formed in opposite directions. A driving device drives the ball screw. The pitch of the pair of the slide blocks is changed in agreement with the pitch of the insertion holes of the board by rotating the ball screw by means of the driving device.

A fixing member folds the lead wires under the board and secures the removed component to the board.

According to the method and apparatus of the present invention, both the insertion direction changing operation and the insertion pitch changing operation are conducted concurrently, so that the insertion cycle time is shortened and the structure is simplified. At the same time, when the double-threaded ball screw is used in the insertion pitch changing mechanism, the ball screw makes it possible to suppress rattling of the screw and maintain a high insertion reliability.

DETAILED DESCRIPTION OF THE PREFERRED EMBODIMENTS

Before the description of the present invention proceeds, it is to be noted that like parts are designated by like reference numerals throughout the accompanying drawings.

Figure 1:
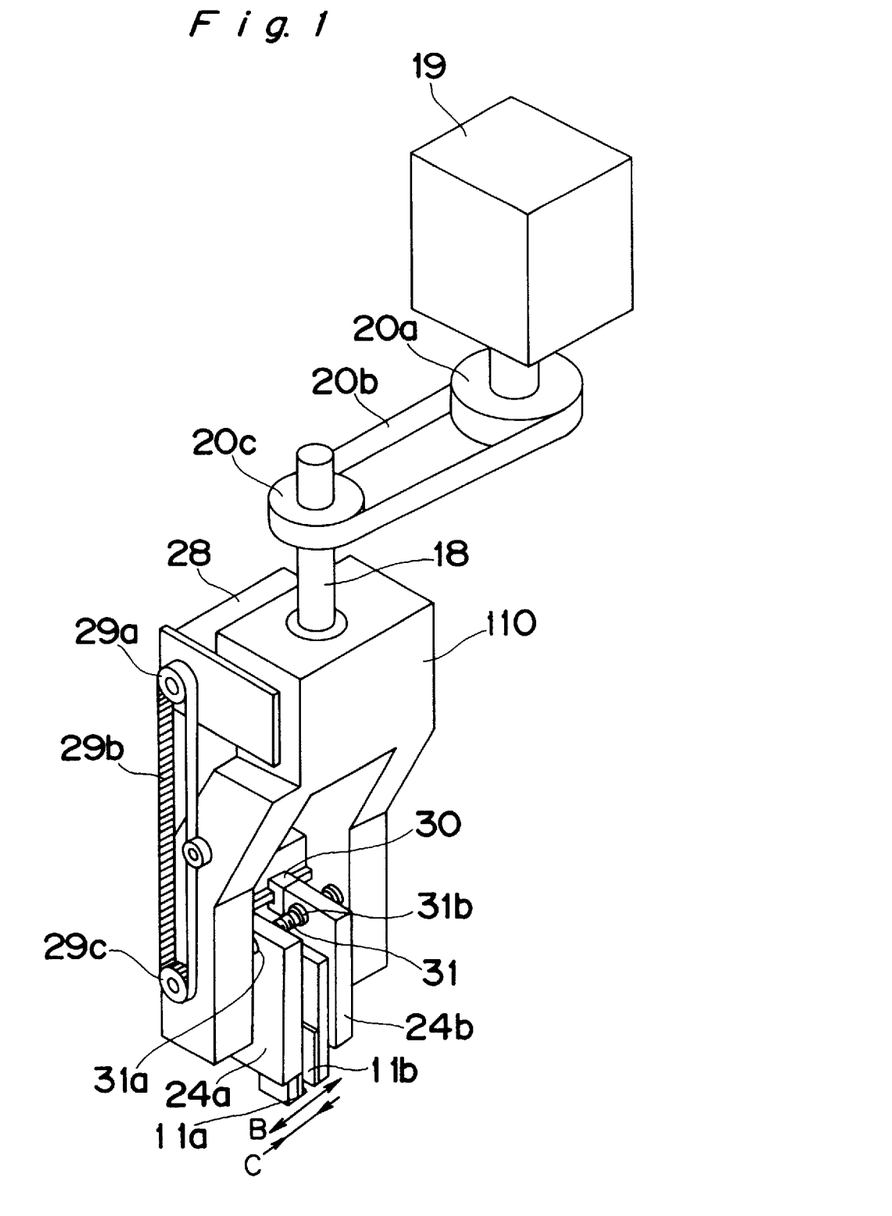
FIG. 1 is a perspective view showing the constitution of an inserting unit of an electronic component inserting apparatus in a preferred embodiment of the present invention.

FIG. 1 is a perspective view of an inserting unit of an apparatus for automatically inserting an axial type of electronic components by which a method is carried out for automatically inserting an axial type of electronic components according to an embodiment of the present invention. In FIG. 1, reference numeral 28 is a rotating/driving device (motor) installed in an insertion head 110, 29a is a driving pulley set to a driving shaft of the rotating/driving device (motor) 28, and 29b is a belt for transmitting the rotation of the rotating/driving device 28 to a driven pulley 29c. An extended shaft of the driven pulley 29c becomes a ball screw 31 threaded in both directions from a central part thereof. Reference numerals 31a and 31b are nut parts of the ball screw 31. Reference numeral 30 is a guide arranged in parallel to the ball screw 31 for holding slide blocks 24a and 24b in a slidable fashion. Parts like those of the conventional apparatus are designated by like reference numerals and the description thereof will be abbreviated here.

The constitution of the inserting apparatus of the embodiment is as indicated in FIG. 1. The insertion guides 11a and 11b are mounted to the slide blocks 24a and 24b, which are supported by the guide 30 to be either close to or away from each other. The guide blocks 24a and 24b are meshed with the nut parts 31a and 31b of the ball screw 31.

The rotation of the rotating/driving device 28 in the insertion head 110 is transmitted from the driving pulley 29a being rotated by the rotating/driving device 28 to the ball screw 31, via the belt 29b and driven pulley 29c, whereby the slide blocks 24a and 24b as well as the insertion guides 11a and 11b mounted to the slide blocks 24a and 24b are moved in a direction of an arrow B or C in FIG. 1. An insertion pitch between the slide blocks 24a and 24b is changed in this manner.

Figure 2:
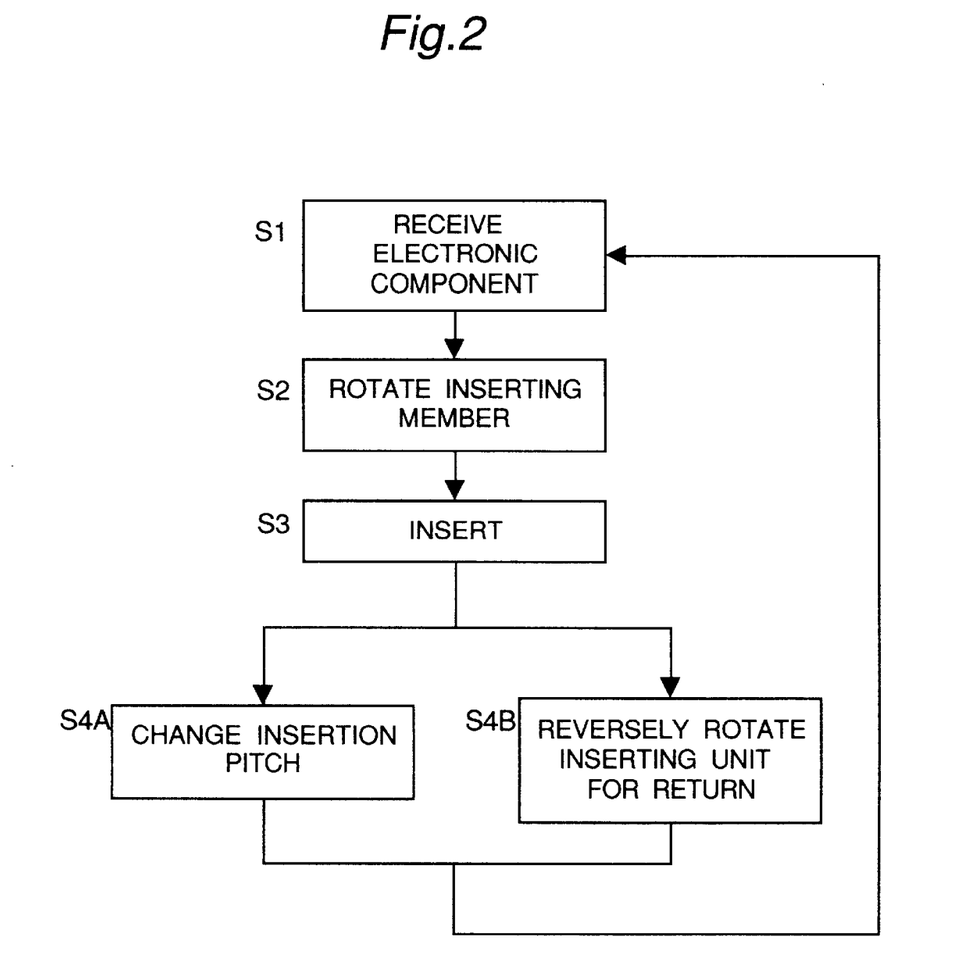
FIG. 2 is a flow chart of an operation of inserting an electronic component into a board in FIG. 1.

An example of an inserting operation in the embodiment will be described with reference to a flow chart of FIG. 2. The flow chart of FIG. 2 is different from FIG. 9 in that while the conventional example comprises the first to fifth steps S21–25, the first step S21 in the conventional example is executed concurrently with the conventional fifth step S25 according to the present embodiment. In other words, the present embodiment comprises a first through a fourth steps S1–5, thus shortening the process by the amount of time of one step. Meanwhile, except for the mechanism and operation of the inserting unit of FIG. 1, the same mechanism and operation as in the component holding member and tape cutting member of FIG. 3, the transferring member of FIG. 4, and the member of FIGS. 5 and 6, where the lead wires 3a and 3b are cut, folded and inserted into the insertion holes 12a on the board 12, are used. Therefore, these drawings will be referred to in the description below.

Figure 9:
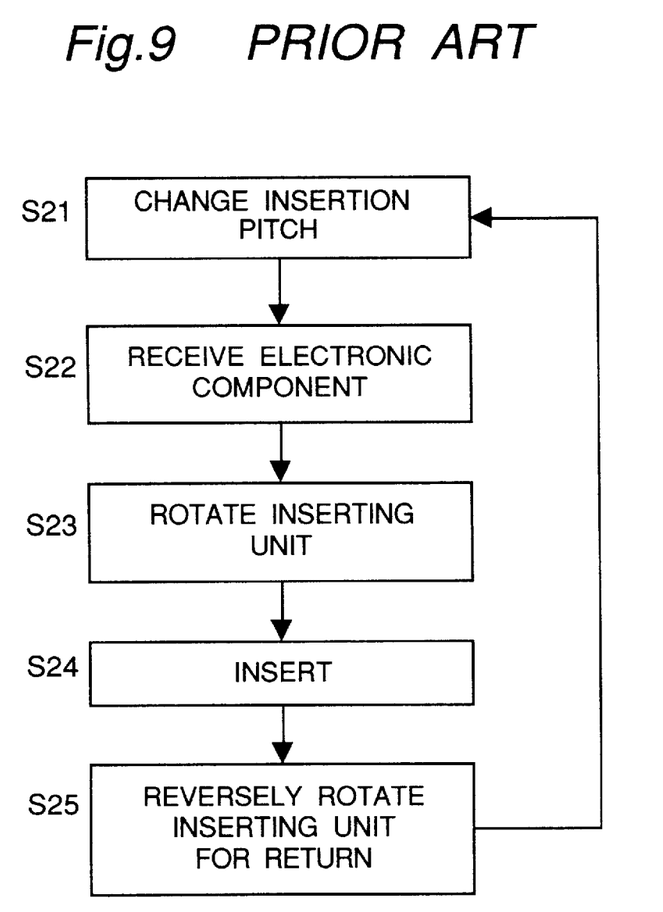
FIG. 9 is a flow chart of an operation of inserting an electronic component into a board in the prior art.

(1) In the first step S1, similar to the second step S22 of the prior art of FIG. 9, one of the electronic components 1 is separated from the tapes 4a and 4b, held by the holding hooks (chucks) 8a and 8b of FIG. 4, and then carried to a predetermined position and delivered to the insertion head 110 of FIG. 1.

(2) In the second step S2, similar to the conventional third step S23 in FIG. 9, because of the rotation of the rotating/driving device 19, the driving shaft 18 is rotated via the driving pulley 20a, belt 20b, and driven pulley 20c. An insertion direction of the insertion head 110 is consequently changed.

(3) In the third step S3, similar to the fourth step S24 of FIG. 9, the lead wires 3a and 3b of the electronic component 1 are cut and folded by the insertion head 110, and the folded lead wires 3a and 3b are held and guided by the insertion guides 11a and 11b to the upper surface of the board 12 as shown in FIG. 6. The main body 2 is pressed by the pusher 14, so that the lead wires 3a and 3b are inserted into predetermined insertion holes 12a of the board 12. Then, a fixing step is carried out wherein the lead wires 3a and 3b of the removed component 1 are folded under the board 12 by a lead wire folding-tool provided in the fixed stage 13 to thereby fix the removed component 1 to the board 12.

The foregoing first-third steps S1–3 are the same as the second–fourth steps S22–24 of the prior art in FIG. 9. The following fourth step S4A and S4B is different from the conventional process of FIG. 9.

(4) In the fourth step S4A and S4B, the driving shaft 18 is rotated by driving the rotating/driving device 19 via the driving pulley 20a, belt 20b, and driven pulley 20c. The insertion head 110 is rotated in an opposite direction to that in the second step S2, that is, returned to an original position in the step S4B (fifth step S25 in FIG. 9). Simultaneously with this, the rotating/driving device 28 in the insertion head 110 is rotated, thereby rotating the double-threaded ball screw 31 via the driving pulley 29a, belt 29b and driven pulley 29c.

As a result, the slide blocks 24a and 24b engaged with the nut parts 31a and 31b of the ball screw 31, the insertion guides 11a and 11b set to the slide blocks 24a and 24b, are moved in the arrow direction B or C. Accordingly, the insertion pitch is changed in the step S4A (first step S21 in FIG. 9) at the same time as the step S4B.

The above-described operation is repeated to thereby insert the lead wires 3a and 3b of the electronic component 1 into the insertion holes 12a of the board 12. If it is not required to change the insertion pitch or insertion direction, the operation therefor will be omitted.

As is described hereinabove, according to the present invention, the rotating/driving device is provided in the inserting unit for inserting the lead wires of the electronic component, and changes the pitch of the pair of slide blocks in correspondence to the insertion pitch of the electronic components into. Since the changing of the insertion direction when the electronic components are inserted into the board is carried out simultaneously with the changing of the pitch of the pair of slide blocks to correspond to the insertion pitch of the electronic components, the insertion cycle time is shortened, and the structure of the inserting unit is simplified.

Moreover, according to the present invention, the changing of the insertion pitch is executed by rotating by means of the rotating/driving device and the double-threaded ball screw set in parallel to the guide, which holds, in a slidable fashion, the slide blocks for cutting/folding/inserting the lead wires. Accordingly, rattling is suppressed, sliding resistances are reduced, and the driving load is lessened.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of inserting electronic components into a board, each of the electronic components having a pair of lead wires that extend in an axial direction, and each of the electronic components being tape bonded at a fixed separation distance, said method comprising:

holding a series of the electronic components with tapes such that the electronic components are tape bonded;

cutting the tapes so as to remove one of the electronic components;

simultaneously holding the tapes and the lead wires of the removed one of the electronic components and transferring the removed one of the electronic components to an insertion position;

cutting and folding the lead wires to a pitch of the insertion holes of the board into which the lead wires are to be inserted, and guiding and inserting the lead wires into the insertion holes of the board;

concurrently changing the insertion direction in which a subsequent electronic component is to be inserted into the board and the pitch by which the subsequent electronic component is to be inserted into the board; and fixing the removed one of the electronic components to the board by folding lead wires of the removed one of the electronic components under the board.

2. A method of inserting electronic components into a board, each of the electronic components having a pair of lead wires that extend in an axial direction, and each of the electronic components being tape bonded at a fixed separation distance, said method comprising:

holding a series of the electronic components with tapes such that the electronic components are tape bonded;

cutting the tapes so as to remove one of the electronic components;

simultaneously holding the tapes and the lead wires of the removed one of the electronic components and transferring the removed one of the electronic components to an insertion position;

cutting and folding the lead wires to a pitch of the insertion holes of the board into which the lead wires are to be inserted with insertion guides that are spaced apart a distance corresponding to the pitch of the insertion holes and positioned for a specified insertion direction for insertion of the removed one of the electronic components, and guiding and inserting the lead wires into the insertion holes of the board with the insertion guides;

concurrently changing the insertion direction in which a subsequent electronic component is to be inserted into the board by changing the position of the of the insertion guides and the pitch by which the subsequent electronic component is to be inserted into the board by changing the distance which the insertion guides are spaced apart to a distance corresponding to the pitch of the insertion holes for the subsequent electronic component; and fixing the removed one of the electronic components to the board by folding lead wires of the removed one of the electronic components under the board.

3. A electronic component inserting apparatus for inserting electronic components into insertion holes of a board, each of the electronic components having a pair of lead wires that extend in an axial direction and tape bonded at a fixed separation distance, said apparatus comprising:

a holding member;

a cutting device positioned adjacent to said holding member;

a transferring member that comprises a pair of holding hooks adapted to simultaneously hold tapes and lead wires of an electronic component that has been held by said holding member and removed by cutting with said cutting device;

an inserting unit capable of receiving an electronic component from said transferring member, said inserting unit being rotatable about an axis extending in the axial direction, and said inserting unit comprising a pair of slide blocks, wherein said slide blocks comprise mechanisms for cutting and folding lead wires of an electronic component in correspondence to a pitch of insertion holes of a board and guiding and inserting the lead wires of an electronic component into the insertion holes;

a driving unit mounted in said inserting unit, said driving unit being connected with said sliding blocks such that said driving unit can relatively move said sliding blocks so as to change the pitch thereof; and a fixing member adapted to fold the lead wires under the board to secure the electronic component to the board when the electronic component is mounted to the board.

4. The apparatus of claim 3, wherein said driving unit comprises:

a motor mounted in said insertion unit, said motor having a driving shaft;

a driving pulley mounted on said driving shaft;

a ball screw having a central part and a thread that is threaded in opposite directions from the central part;

a driven pulley mounted with said ball screw;

a belt extending between said driving pulley and said driven pulley to transmit rotation from said driving pulley to said driven pulley; and nut parts connected with said sliding blocks, said nut parts being meshed with said ball screw such that when said motor is operated, said ball screw is rotated by said driving pulley, said belt and said driven pulley so as to move said slide blocks in one of two directions, toward said central part of said ball screw and toward ends of said ball screw, so as to change the pitch of said sliding blocks.

5. The apparatus of claim 3, and further comprising a means for rotating said inserting unit about the axis thereof to a position corresponding to a specified direction of insertion of lead wires into the board and a means for operating said driving unit such that the pitch of said pair of sliding blocks is changed at the same time said means for rotating rotates said inserting unit about the axis to the position corresponding to a specified direction of insertion.

6. A electronic component inserting apparatus for inserting electronic components into insertion holes of a board, each of the electronic components having a pair of lead wires that extend in an axial direction and are tape bonded at a fixed separation distance, said apparatus comprising:

a holding member;

a cutting device positioned adjacent to said holding member;

a transferring member that comprises a pair of holding hooks adapted to simultaneously hold tapes and lead wires of an electronic component that has been held by said holding member and removed by cutting with said cutting device;

an inserting unit that is rotatable about an axis extending in the axial direction, said inserting unit comprising a pair of slide blocks, a guide member engaged with said slide blocks so as to slidably guide said slide blocks, a ball screw parallel to said guide member having threads formed in opposite directions, said threads being engaged with respective ones of said slide blocks, a driving device in said inserting unit operatively connected with said ball screw, wherein said slide blocks comprise mechanisms for cutting and folding lead wires of an electronic component in correspondence to a pitch of insertion holes of a board and guiding and inserting the lead wires of an electronic component in to the insertion holes, and whereby the pitch of said pair of slide blocks can be changed in correspondence with the pitch of the insertion holes of the board by rotating said ball screw with said driving device; and a fixing member adapted to fold the lead wires under the board to secure the electronic component to the board when the electronic component is mounted to the board.

\* \* \* \* \*